United States Patent [19]

Otala

[11] Patent Number: 4,499,431
[45] Date of Patent: Feb. 12, 1985

[54] DRIVER CIRCUIT CONFIGURATION FOR THE OUTPUT STAGE OF ELECTRONIC POWER AMPLIFIERS

[75] Inventor: Matti N. Otala, Oulu, Finland
[73] Assignee: Shin-Shirasuna Electric Corp., Nagoya, Japan
[21] Appl. No.: 374,412
[22] Filed: May 3, 1982
[30] Foreign Application Priority Data
 Jul. 8, 1981 [JP] Japan .................. 56-106424
[51] Int. Cl.³ .............................................. H03F 1/26
[52] U.S. Cl. .................................... 330/296; 330/149; 330/267; 330/270
[58] Field of Search ............... 330/149, 296, 263, 267, 330/270, 289

[56] References Cited
PUBLICATIONS

Robert Widlar, "A New Breed of Linear ICS Runs at 1-volt Levels", Electronics, Mar. 29, 1979, vol. 52, No. 7.

Primary Examiner—James B. Mullins
Assistant Examiner—G. Wan

[57] ABSTRACT

An apparatus for improving the salient properties of the output stages of electronic power amplifiers v.s. varying load conditions. A novel circuit, based on current feedback sensing the instantaneous drive current of the output devices, is used to linearize the output characteristics of the output devices. The important features, compared with the presently known and employed drive circuits, relate to a more linear transfer characteristic, much larger output current capability, and more output amplifier design.

7 Claims, 4 Drawing Figures

DRIVER CIRCUIT CONFIGURATION FOR THE OUTPUT STAGE OF ELECTRONIC POWER AMPLIFIERS

BACKGROUND OF THE INVENTION

1. Field of the Invention

This invention relates to an apparatus for linearizing and improving the characteristics of electronic power amplifiers with regard to varying resistive and/or reactive, possibly nonlinear loads, to yield more economical amplifier designs. To this end, the apparatus incorporates the combination of semiconductor devices, current and voltage sources, and passive electronic components. In addition to these, the practical realizations of the invention may make additional use of various mechanical and electromechanical parts and components, as is customary in power amplifier circuits.

2. Description of the Prior Art

An ordinary prior-art amplifier circuit is illustrated in FIG. 1, wherein semiconductor transistors $Q_{1A}$ and $Q_{1B}$, connected to supply voltage sources $+V$ and $-V$ respectively, are used as output devices for the amplifier, which feed a load L. The section driving the output devices consists of semiconductor transistors $Q_{2A}$ and $Q_{2B}$ forming a grounded collector circuit configuration, and of semiconductor transistors $Q_{3A}$ and $Q_{3B}$ which drive the transistors $Q_{2A}$ and $Q_{2B}$ in a grounded emitter circuit configuration. Diodes $D_1$ to $D_4$ form the necessary bias voltage in order to allow current to flow through the transistors $Q_{2A}$, $Q_{2B}$, $Q_{3A}$, $Q_{3B}$, in the quiescent state. Emitter resistors $R_1$ and $R_2$ are used to linearize the output section, and to prevent thermal runaway should the output devices for any reason become overheated. For reasons of linearity and speed of operation, a resistor $R_3$ is used to pass appreciable additional current through the transistors $Q_{2A}$ and $Q_{2B}$ in excess of the base currents of the output devices.

It is to be understood that many practical variations exist of the circuit described above; and that the circuit may be realized with various kinds of semiconductor devices and may be used with asymmetric as well as with symmetric power supply sources; and that in an asymmetric amplifier version, the semiconductor devices denoted by subscript A and B respectively, may be replaced with current sources or equivalent electronic means, without departing from the basic concept of operation outlined above, and without curing any or all of the drawbacks described below.

The prior-art circuit arrangement described above has, among others, the following drawbacks: (i) The current gains $\beta_1$ and $\beta_2$ of the transistors $Q_{1AB}$ and $Q_{2AB}$ are dependent on the actual load current. Therefore, even in the event of a perfectly linear resistive load L, the loading seen at the collectors of the transistors $Q_{3A}$ and $Q_{3B}$ becomes nonlinear and causes appreciable distortion, i.e., non-linearity of the output voltage v.s. the input voltage. (ii) It is inherent in basic semiconductor device physics that the current gains $\beta_1$ and $\beta_2$ decrease rapidly after a certain current through the respective transistor is reached. This places a practical limit to the maximum output current of the circuit, which cannot be exceeded without gross nonlinearity. (iii) The base-to-emitter voltage drops $V_{be}$ of the semiconductor transistors $Q_{1AB}$ and $Q_{2AB}$ depend on current and temperature, thereby adding another source of nonlinearity to the circuit. This non-linearity is further aggravated by the continuous and momentary variation of the temperature of the semiconductor devices with their power dissipation, i.e., change in the product of collector current and collector-emitter voltage with the signal to be amplified. (iv) Because of the grounded collector circuit configuration of the driver transistors $Q_{2A}$ and $Q_{2B}$ can easily drive $Q_{1A}$ and $Q_{1B}$ on, i.e., to carry more current, but can only limitedly turn them off, i.e., draw away current carriers from their bases.

All these inherent drawbacks necessitate use of heavy overall feedback to correct for these degradations. Feedback, in turn, has been shown to create several other problems so that designs relying heavily on the usage of feedback must be considered inferior to designs which do not necessitate its usage.

Accordingly, it is an object of the present invention to provide an apparatus for improving the characteristics of transistorized power amplifiers, the apparatus being designed to yield a highly linear and economical high-speed amplifier circuit.

BRIEF DESCRIPTION OF THE DRAWING

Other objects, features and advantages of the present invention will become apparent from the ensuing description taken in conjunction with the accompanying drawings.

DESCRIPTION OF PREFERRED EMBODIMENT

In all the embodiments of the present invention which will be described below, use is made of semiconductor transistors and semiconductor diodes, together with passive electronic components. However, the present invention, and the principles described herein, are equally adaptable to the use of any other semiconductor devices, as well as to the use of thermionic valves, without departing from the spirit and scope of the novel concepts of the present invention.

Figure 1:
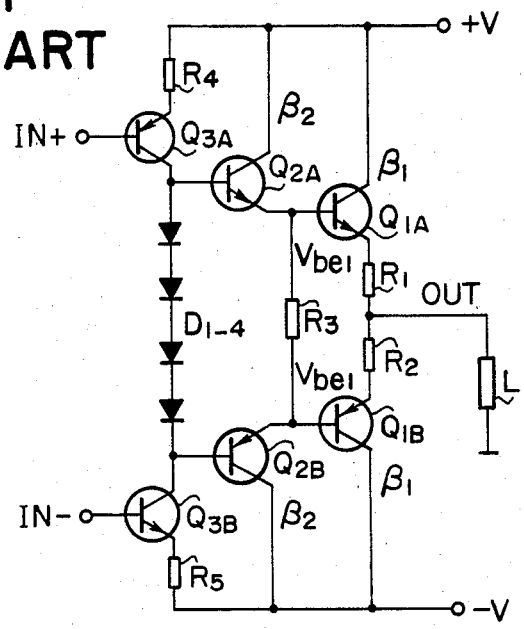
FIG. 1 is a circuit diagram showing a prior-art amplifier circuit incorporating a driver configuration and an output stage.
Figure 2:
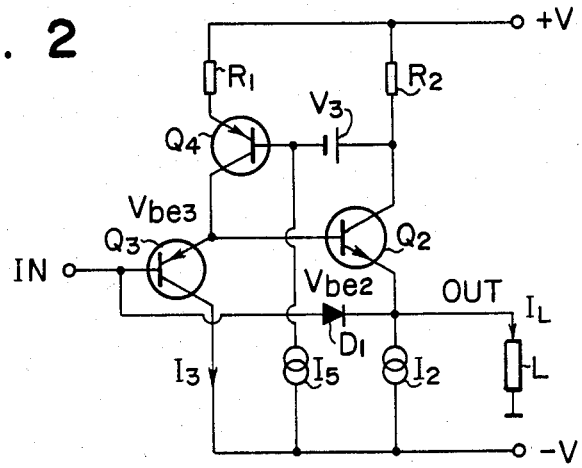
FIG. 2 is a circuit diagram showing the simplified asymmetric circuit according to an embodiment of the present invention.

FIG. 2 illustrate the basic concepts of the present invention. It shows an asymmetrical unity-gain driver circuit which operates from symmetrical power supply sources $+V$ and $-V$ as follows: In the quiescent state, i.e., at zero output voltage and zero output current to a load L, the currents through semiconductor devices $Q_3$ and $Q_4$ are set by adjusting voltage source $V_3$. The voltage drop across resistor $R_2$ is assumed to be small because of a dimensioning rule outlined below. The current through semiconductor device $Q_2$ is set forth by current source $I_2$. When the input voltage increases, current $I_L$ flowing through the load L causes an additional voltage drop through resistor $R_2$, thereby causing current $I_4$ through transistor $Q_4$ to increase in direct proportionality with the current $I_L$. A part of the current $I_4$ is diverted to the base of the transistor $Q_2$ so as to compensate for the increased base current, while the rest flows through transistor $Q_3$.

To yield the most desirable results, the following dimensioning rule is applied: The ratio of $R_1$ to $R_2$ is so chosen as to cause such an increase in the current $I_4$ that: (i) The increase in the base current of the transistor $Q_2$ is fully compensated for. (ii) The rest of the current $I_4$, i.e., the current $I_3$ through the transistor $Q_3$, increases so much that the base-to-emitter voltage drop $V_{be3}$ of the transistor $Q_3$ increases in equal amount to the increase in the corresponding voltage drop $V_{be2}$ in the transistor $Q_2$.

When the above dimensioning rule is fulfilled, it is evident that the output voltage to the load L will be an exact replica of the input voltage, irrespective of the magnitude, character, and linearity of the load L.

From the above, it is also evident that the description is conversely valid should the input voltage decrease.

In addition to the component parts named above, current source $I_5$ is used to set a bias current for the transistor $Q_4$, and a semiconductor diode $D_1$ is used to protect the semiconductor transistor $Q_3$ from base reverse breakdown, should the input voltage exceed by large amounts the output voltage in case of an unforeseen situation, e.g., short-circuit at load L.

As will be appreciated from the above, the circuit configuration of FIG. 2 has, among others, the following advantages: (i) Since the above dimensioning principle renders the output voltage to become independent of the load characteristics, and thereby eliminate the influence of amplifier internal parameters from the performance, the circuit linearity is greatly enhanced. (ii) Since the amount of excess current through transistor $Q_3$ can be tailored at will, no variation in the input impedance of the circuit is seen, irrespective of the variation in the load L, or the output voltage. (iii) Since the transistor $Q_3$ is able, by virtue of its inverted grounded collector circuit configuration, to efficiently draw current carriers from the base of the transistor $Q_2$, the operational speed of $Q_2$ is greatly enhanced.

Figure 3:
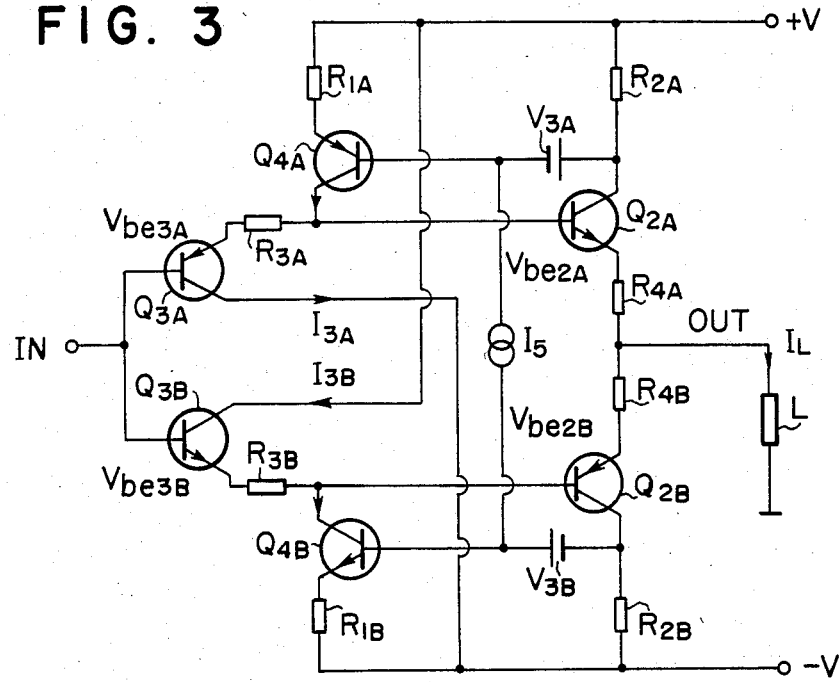
FIG. 3 is a circuit diagram showing the symmetrical complementary circuit according to another embodiment of the present invention.

FIG. 3 illustrates a second, symmetrical embodiment of the invention. This operates in a fashion similar to the first embodiment described above, however, with the added benefit of being able to drive both positive and negative currents to the load L without a limitation set forth by the current source $I_2$ of the circuit of FIG. 2 with regard to the maximum negative current $I_L$.

In this second embodiment, resistors $R_{4A}$ and $R_{4B}$ are added to the emitters of transistors $Q_{2A}$ and $Q_{2B}$ in order to prevent thermal runaway in the case of inadequate heatsinking of, or excessive power dissipation in, the transistors $Q_{2A}$ and $Q_{2B}$. Consequently, resistors $R_{3A}$ and $R_{3B}$ are added into the emitters of transistors $Q_{3A}$ and $Q_{3B}$ to complete the desirable properties of the invention with the following modification of the dimensioning rule described in the discussion above of the first embodiment of the invention, to wit: By proper judgement, the resistors $R_{1AB}$ and $R_{1AB}$ are so dimensioned that when the load current increases in either direction: (i) The increase in the base current of the transistors $Q_{2A}$ and $Q_{2B}$ is fully compensated for by the increase in the current $I_{4A}$ or $I_{4B}$. (ii) The additional increase of the current $I_{4A}$ or $I_{4B}$, flowing as current $I_{3A}$ or $I_{3B}$ through transistor $Q_{3A}$ or $Q_{3B}$, causes the base-to-emitter voltage $V_{be3A}$ or $V_{be3B}$ of the transistor $Q_{3A}$ or $Q_{3B}$ to increase exactly as much as the base-to-emitter voltage $V_{be2A}$ or $V_{be2B}$ increases in the transistors $Q_{2A}$ or $Q_{2B}$ because of the increased current through them. (iii) Resistors $R_{3A}$ and $R_{3B}$ are now dimensioned so that the additional voltage drop across them, caused by the increase in the current $I_{3A}$ or $I_{3B}$, exactly equals the additional voltage drop in the resistors $R_{4A}$ or $R_{4B}$, caused by the increase of the current $I_L$ flowing through the load L.

All the other salient and desirable properties of the first embodiment of the invention find their equal and undiminished realization in this second embodiment. Exactly as in the first embodiment of the invention, current source $I_5$ and voltage sources $V_{3A}$ and $V_{3B}$ are used and dimensioned to set the quiescent currents and voltages in the circuit.

Figure 4:
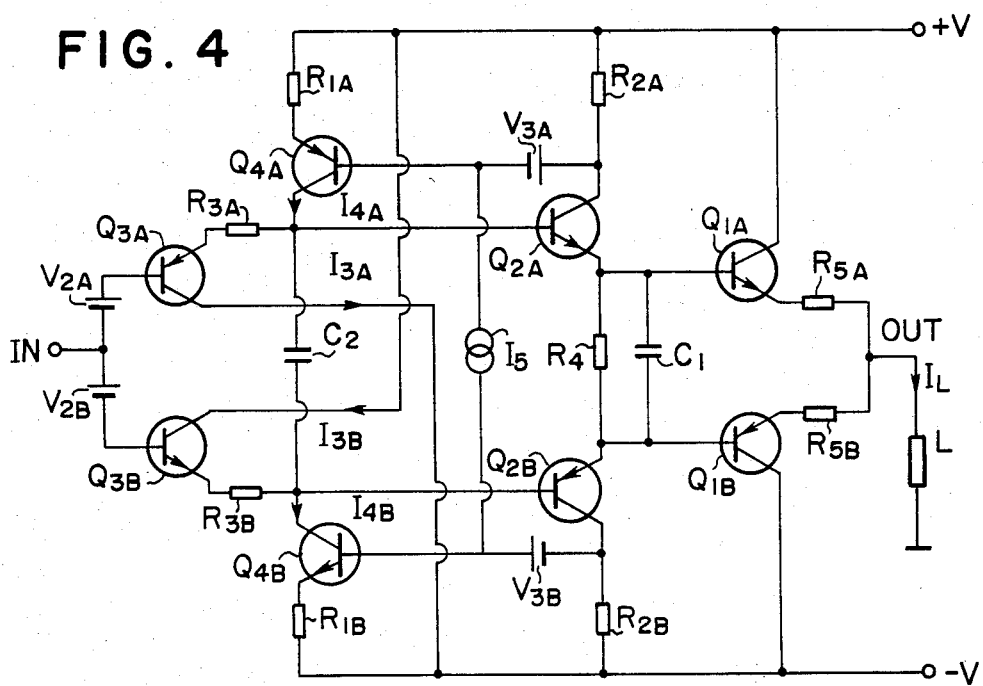
FIG. 4 is a circuit diagram showing the circuit arrangement according to a third embodiment of the present invention.

FIG. 4 illustrates a third embodiment of the invention, showing one of the many and varied ways of using the principles described herein to drive single or multiple pairs of output devices $Q_{1A}$ and $Q_{1B}$. The operation of the circuit of FIG. 4 is analogous to those described before, however, with the following added remarks: (i) The optimum dimensioning rule now calls for the increase in the base-to-emitter voltage of $Q_{3A}$ or $Q_{3B}$, due to increase in current $I_{3A}$ or $I_{3B}$, equal to the sum of the increases of the base-to-emitter voltages of $Q_{2A}$ and $Q_{1A}$, or $Q_{2B}$ and $Q_{1B}$, respectively; and presumes the additional voltage drop across resistor $R_{3A}$ or $R_{3B}$ due to the said increase in current $I_{3A}$ or $I_{3B}$ to equal the voltage drop across resistors $R_{5A}$ and $R_{5B}$; all due to increased load current $I_L$. (ii) Capacitors $C_1$ and $C_2$ are used to enhance the operational speed of the circuit, while additional voltage sources $V_{2A}$ and $V_{2B}$ cater for bias voltages, and consequently bias currents, for the circuit.

It will be understood that innumerable modifications and variations may be effected in the circuits and principles described without departing from the spirit and scope of the novel concepts of this invention.

What is claimed is:

1. A circuit for improving the characteristics of a transistorized power amplifier, comprising:
    a common collector stage, an inverted common collector stage together with a common emitter stage for driving said collector stage, and means associated with said stages for sensing the output current of said circuit; and
    means connected to said circuit for transforming said output current into a corresponding internal correction signal for compensating for nondesirable circuit characteristics upon changes in said output current, and means for compensating for variation in input current or voltage of said circuit, to thereby yield an output voltage essentially independent of load and signal characteristics.

2. A circuit according to claim 1, wherein said sensing means are resistors.

3. A circuit according to claim 1, wherein said sensing means are electronic means.

4. A circuit according to claim 1, further comprising means for protecting said circuit from excess power dissipation.

5. A circuit according to claim 1, further comprising means for protecting said circuit from excess overheating.

6. A circuit according to claim 1, further comprising means for protecting said circuit from excess power dissipation and overheating.

7. A circuit according to claim 1, comprising capacitive means in said common emitter stage to thereby increase the operation speed of said circuit.

* * * * *